(12) United States Patent
Huang et al.

(10) Patent No.: US 11,650,274 B2
(45) Date of Patent: May 16, 2023

(54) METHOD FOR ACQUIRING NMR PHASE-SENSITIVE 2D J-RESOLVED SPECTRUM BY SUPPRESSING STRONG COUPLING SPURIOUS PEAKS

(71) Applicant: Xiamen University, Fujian (CN)

(72) Inventors: Yuqing Huang, Fujian (CN); Zhong Chen, Fujian (CN); Cunyuan Gao, Fujian (CN); Haolin Zhan, Fujian (CN)

(73) Assignee: Xiamen University, Fujian (CN)

( * ) Notice: Subject to any disclaimer, the term of this patent is extended or adjusted under 35 U.S.C. 154(b) by 0 days.

(21) Appl. No.: 17/712,548

(22) Filed: Apr. 4, 2022

(65) Prior Publication Data

US 2022/0317214 A1 Oct. 6, 2022

(30) Foreign Application Priority Data

Apr. 2, 2021 (CN) .......................... 202110360701.6

(51) Int. Cl.
*G01R 33/485* (2006.01)
*G01R 33/46* (2006.01)

(52) U.S. Cl.
CPC ....... *G01R 33/485* (2013.01); *G01R 33/4625* (2013.01)

(58) Field of Classification Search
CPC .. G01R 33/4625; G01R 33/485; G01N 24/08; G01N 24/081; G01N 24/082; G01N 24/084; G01N 24/085; G01N 24/087; G01N 24/088

See application file for complete search history.

(56) References Cited

U.S. PATENT DOCUMENTS

2010/0001727 A1\* 1/2010 Frydman ............ G01R 33/4822
324/318
2020/0011817 A1\* 1/2020 Chen .................. G01R 33/4633

FOREIGN PATENT DOCUMENTS

| CN | 102305918 A | | 1/2012 | |
|----|---|---|---|---|
| CN | 106841270 A | | 6/2017 | |
| CN | 106872506 A | \* | 6/2017 | ............ G01N 24/08 |
| CN | 107894436 A | \* | 4/2018 | ........... G01N 24/087 |

(Continued)

OTHER PUBLICATIONS

M. Foroozandeh, R. W. Adams, P. Kiraly, M. Nilsson, and G. A. Morris, Measuring couplings in crowded NMR spectra: pure shift NMR with multiplet analysis Chem. Commun. 51, 15410-15413 (2015). (Year: 2015).\*

(Continued)

*Primary Examiner* — Steven L Yeninas
(74) *Attorney, Agent, or Firm* — Cooper Legal Group, LLC

(57) ABSTRACT

A method for acquiring nuclear magnetic resonance (NMR) phase-sensitive two-dimensional (2D) J-resolved spectrum by suppressing strong coupling spurious peaks, comprising: 1) placing a sample, collecting a conventional one-dimensional (1D) spectrum of the sample, and measuring a time width (pw) of a 90° pulse, wherein the conventional 1D spectrum provides J coupling information and chemical shift information of the sample; and 2) introducing a pulse sequence for suppressing strong coupling, setting parameters of a chirp sweep frequency pulse, a pure shift yielded by chirp excitation (PSYCHE) module, and a J sampling module, and collecting and saving data of a spectrum.

6 Claims, 4 Drawing Sheets

(56) References Cited

FOREIGN PATENT DOCUMENTS

| CN | 110672650 A | 1/2020 |
| CN | 110988006 A | 4/2020 |

OTHER PUBLICATIONS

M. Foroozandeh, R. W. Adams, N. J. Meharry, D. Jeannerat, M. Nilsson, and G. A. Morris, Ultrahigh-Resolution NMR Spectroscopy Angew. Chem., Int. Ed. 53, 6990-6992 (2014). (Year: 2014).*

M. Foroozandeh, G. A. Morris, and M. Nilsson, PSYCHE Pure Shift NMR Spectroscopy Chem. Eur. J. 24, 13988-14000 (2018). (Year: 2018).*

Haolin Zhan, Fengqi Zhan, Cunyuan Gao, et al., Multiplet analysis by strong-couplingartifact-suppression 2D J-resolved NMR spectroscopy, J. Chem. Phys. 155, 034202 (2021) (Year: 2021).*

Yuqing Huang et al.: "A Pure Shift-Based NMR Method for Transverse Relaxation Measurements on Complex Samples", IEEE Transactions on Instrumentation and Measurement, Jan. 2020, 201-211.

* cited by examiner

METHOD FOR ACQUIRING NMR PHASE-SENSITIVE 2D J-RESOLVED SPECTRUM BY SUPPRESSING STRONG COUPLING SPURIOUS PEAKS

RELATED APPLICATIONS

This application claims priority to Chinese patent application 202110360701.6, filed on Apr. 2, 2021. Chinese patent application 202110360701.6 is incorporated herein by reference.

FIELD OF THE DISCLOSURE

The present disclosure relates to a field of nuclear magnetic resonance (NMR) spectroscopy detection, and in particular relates to a method for acquiring nuclear magnetic resonance phase-sensitive two-dimensional (2D) J-resolved spectrum by suppressing strong coupling spurious peaks.

BACKGROUND OF THE DISCLOSURE

NMR spectroscopy is an important technology in the field of nuclear magnetic resonance, in which the study of pure chemical shifts and J-coupling constants plays an important role. NMR is often used in the fields of molecular structure analysis and composition detection. The current NMR spectroscopy technology faces many challenges, such as the narrow chemical shift distribution range (0-15 ppm) of $^1H$ nuclei in the one-dimensional (1D) spectrum and the wide J-coupling splitting, which makes the 1D spectrum show chemical shift and J-coupling information very crowded and not conducive to the analysis of molecular structures by people. Therefore, studies mostly display chemical shift and J-coupling information in the form of 2D spectrum. The research on 2D spectrum solves the above-mentioned problems, such as spectrum crowding. The realization process can be divided into four stages: preparation period, evolution period t1, mixing period, and sampling period t2. The evolution period t1 and the sampling period t2 constitute a 2D spectrum diagram data. Conventional 2D J-resolved spectrum (2D J spectrum) provides information on chemical shifts and J-coupling constants in these two dimensions, often showing J-coupling information in the indirect F1 dimension and chemical shift information in the direct F2 dimension. However, the conventional 2DJ spectrum has two problems. First, the acquired signal is affected by the phase modulation of the evolution period t1 and the sampling period t2, so the signal suffers from the problem of phase distortion when the spectrum is displayed. Second, the strong coupling pseudo peak appears in the pure chemical shift 1D spectrum projected by the spectrum and appears in the 2D spectrum in a form of strong coupling spurious peaks.

The conventional 2DJ spectroscopy is affected by the phase modulation of the indirect dimension evolution period $t_1$ and the direct dimension sampling period t2, which makes the conventional 2DJ spectrum with phase distortion in two dimensions. The phase distortion of the conventional 2DJ spectrum cannot be handled by a simple phase modulation operation, so the conventional 2DJ spectrum is often displayed in absolute value mode, which can avoid the phase distortion problem of the signal. Spectrum representation in absolute value mode results in increased peak linewidth and decreased spectral resolution. In order to solve the above-mentioned phase distortion problem, people perform phase-sensitive processing on the acquired 2D spectrum to obtain a 2D phase-sensitive spectrum. In the strong coupling system, the strong coupling spurious signal is mainly caused by the strong coupling effect of the 180° non-selective hard pulse, and the strong coupling spurious signal shares the same coherent path with the objective signal. Therefore, the strong coupling spurious signal cannot be suppressed by using the phase cyclic method, and even the 2D spectrum with phase-sensitive processing cannot avoid the strong coupling spurious peaks in the strong coupling system. Therefore, it is necessary to propose a spectroscopic method that can ensure the natural linewidth of spectrum lines while solving the problem of spectrum peak phase distortion and can effectively suppress strong coupling spurious peaks in the strong coupling system.

BRIEF SUMMARY OF THE DISCLOSURE

The present disclosure provides a method for acquiring nuclear magnetic resonance (NMR) phase-sensitive 2D J-resolved spectrum by suppressing strong coupling spurious peaks, which suppresses a generation of the strong coupling spurious peak and has a great significance to study the 2D J-resolved spectrum in the field of NMR spectroscopy.

The present disclosure comprises the following steps. A method for acquiring nuclear magnetic resonance (NMR) phase-sensitive two-dimensional (2D) J-resolved spectrum by suppressing strong coupling spurious peaks comprises:

1) Placing a sample, collecting a conventional one-dimensional (1D) spectrum of the sample, and measuring a time width (pw) of a 90° pulse, wherein the conventional 1D spectrum provides J coupling information and chemical shift information of the sample.

2) Introducing a pulse sequence for suppressing strong coupling, setting parameters of a chirp sweep frequency pulse, a pure shift yielded by chirp excitation (PSYCHE) module, and a J sampling module, and collecting and saving data of a spectrum, wherein the pulse sequence for suppressing the strong coupling comprises a 90° non-selective hard pulse, a first delay module $\tau_1$, a 180° forward chirp sweep frequency pulse, a second delay module $\tau_2$, a first t1/2, the PSYCHE module, a 180° reverse chirp sweep frequency pulse, a second t1/2, and a J sampling module in sequence.

In a preferred embodiment, in the pulse sequence for suppressing strong coupling: a sweep direction of the 180° forward chirp sweep frequency pulse is opposite to a sweep direction of the 180° reverse chirp frequency sweep pulse, and the method comprises adding a weak gradient field pulse G2 and a weak gradient field pulse G6 on the 180° forward chirp sweep frequency pulse and the 180° reverse chirp sweep frequency pulse.

In a preferred embodiment, the PSYCHE module comprises two chirp sweep frequency pulses with a flip angle β.

In a preferred embodiment, the J sampling module comprises 2N of 180° non-selective hard pulses and a pulse of a dispersion phase gradient field pulse G7.

In a preferred embodiment, obtaining pw parameters according to the conventional 1D spectrum, setting a sweep frequency range, a sweep frequency time, and a sweep frequency power of the 180° forward chirp sweep frequency pulse and the 180° reverse chirp frequency sweep pulse according to the pw parameters, the weak gradient field pulse G2, the weak gradient field pulse G6, the flip angle β of the two chirp sweep frequency pulses in the PSYCHE module, cycle times of the J sampling module, and the dispersion phase gradient field pulse.

In a preferred embodiment, the flip angle β is 8°-20°.

In a preferred embodiment, post-processing the data of the spectrum saved in step 2 using a Matrix Laboratory (MATLAB) software, and displaying a 2D spectrum in a form of a contour map.

In a preferred embodiment, the post-processing is processing the data of the spectrum saved in step 2 into a form of a phase-sensitive spectrum.

In a preferred embodiment, the post-processing comprises following steps:

a) Splicing the data of the spectrum saved in step 2, wherein the splicing is splicing odd-numbered sampling of the data of the spectrum saved in step 2 in the J sampling module, that is, the splicing is splicing odd-numbered data selected from the cycle times.

b) Applying a 2D Fourier transform to the data spliced in step a to obtain a first 2D spectrum.

c) Flipping an F1 dimension of the first 2D spectrum to obtain a second 2D spectrum, and adding to the first 2D spectrum to the second 2D spectrum to obtain an NMR 2D phase-sensitive J spectrum by suppressing the strong coupling spurious peaks.

In a preferred embodiment, a method for acquiring nuclear magnetic resonance (NMR) phase-sensitive 2D J-resolved spectrum by suppressing strong coupling spurious peaks comprises suppressing the strong coupling spurious peaks by replacing 180° non-selective hard pulses with 180° chirp sweep frequency pulses.

Compared with the existing techniques, the present disclosure has the following advantages.

1) The method for acquiring the NMR phase-sensitive 2D J-resolved spectrum by suppressing strong coupling spurious peaks provided by the present disclosure replaces the 180° non-selective hard pulse by the two 180° chirp sweep frequency pulses. In this way, the sweep frequency direction of the two 180° chirp sweep frequency pulses are opposite. The weak gradient field pulse G2 and the weak gradient field pulse G6 enable the external magnetic field applied to the sample to perform a spatial gradient distribution, so that the sample is excited by spatial sweep frequency due to the two 180° chirp sweep frequency pulses so as to suppress a strong coupling effect. The method for acquiring the NMR phase-sensitive 2D J-resolved spectrum for suppressing strong coupling spurious peaks provided by the present disclosure has a remarkable suppression effect on strong coupling spurious peaks in a strong coupling system and can achieve the phase-sensitive spectrum by suppressing a strong coupling in a single experiment.

2) The present disclosure provides the method for acquiring the NMR phase-sensitive 2D J-resolved spectrum by suppressing strong coupling spurious peaks, which is used for multi-peak analysis of complex chemical samples and is involved in a field of NMR detection spectroscopy. The method uses two chirp sweep frequency pulses having opposite directions to achieve suppressing the strong coupling spurious peaks, wherein the PSYCHE module is used to obtain pure chemical displacement information from a direct dimension and eliminate evolutionary effects of J coupling. J coupling information is recovered by the J sampling module in the indirect dimension by refocusing chemical displacement, and collected original signals are processed by post-processing to obtain an NMR phase-sensitive J resolved spectrum by suppressing the strong coupling spurious peaks. The present disclosure has remarkable effects in inhibiting the strong coupling spurious peaks and has great significance for a pure chemical displacement study in NMR spectroscopy.

DETAILED DESCRIPTION OF THE EMBODIMENTS

Figure 1:
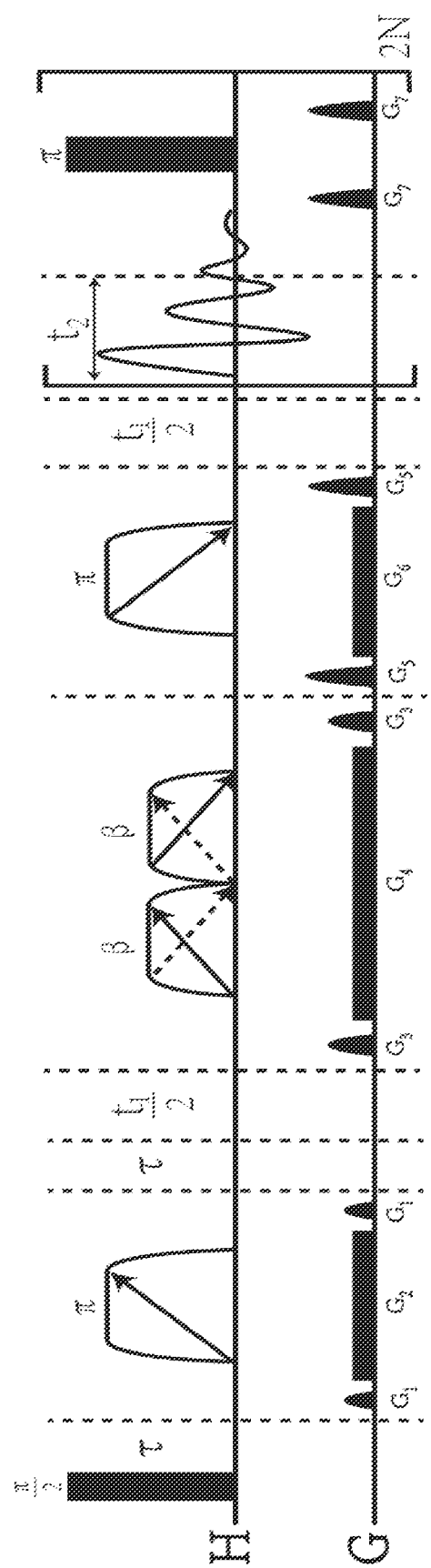
FIG. 1 illustrates a pulse sequence diagram, in which black solid rectangles represent non-selective hard pulses, rectangles with arrows represent chirp frequency-sweep pulses, directions of the arrows represent frequency-sweep directions, $G_1$, $G_3$, $G_5$, and $G_7$ represent dispersion phase gradient field pulses, and $G_2$ and $G_4$ represent multi-layer spatial gradient field pulses.

The technical solutions of embodiments of the present disclosure will be clearly and completely described below in combination with the accompanying embodiments and drawings of the present disclosure. It is obvious that the described embodiments are some embodiments of the present disclosure and are not all the embodiments, and the present disclosure covers all other embodiments provided they are made without creative works by those having ordinary skill in the art based on the embodiments of the present disclosure.

In the description of the present disclosure, it should be noted that the terms "upper", "lower", "inner", "outer", "top/bottom", etc. indicate an orientation or a positional relationship based on the orientation shown in the drawings. The orientation and the positional relationship is only for convenience for describing the present disclosure and simplifying the description, rather than indicating or implying that the referenced device or the referenced element must have a specific orientation or be constructed and operated in the specific orientation, and therefore the orientation and the positional relationship should not be understood as a limitation of the present disclosure. In addition, the terms "first" and "second" are only used for descriptive purposes and should not be understood as indicating or implying relative importance.

In the description of the present disclosure, unless otherwise described, it should be noted that the terms "installed", "disposed with", "socketed/sleeved", "connected", etc., should be broadly understood, such as "connection" can be a wall-mounted connection, a detachable connection, an integral connection, a mechanical connection, an electrical connection, a direct connection, an indirect connection through an intermediate medium, or a connection between two components. For those of ordinary skill in the art, the specific meaning of the above-mentioned terms in the present disclosure can be understood under specific conditions.

This embodiment proposes a method for preparing nuclear magnetic resonance (NMR) two-dimensional (2D) J-resolved spectrum by suppressing strong coupling spurious peaks, the method comprises the following steps:

1) Placing a sample to be tested;

2) Performing tuning, field locking, and shimming in a software operating interface of an NMR spectrometer, introducing a conventional one-dimensional (1D) $^1$H spectrum sequence, and measuring a time width (pw) required by 90° pulse;

3) Creating a new workspace, introducing a conventional homo-nuclear 2D J-resolved spectrum sequence, setting parameters of the 90° pulse and a 180° non-selective pulse, and collecting a conventional 2D J-resolved spectrum;

4) Creating a new workspace, introducing a pulse sequence designed by this method, and setting parameters of a 180° chirp frequency sweep pulse, a pure shift yielded by chirp excitation (PSYCHE) module, and a J sampling module, and collecting 2D spectrum data after setting the parameters. A parameter of the 180° chirp frequency sweep pulse comprise a frequency sweep width, a frequency sweep time, and a sweep power. The PSYCHE module comprises two small-angle chirp frequency sweep pulses in opposite directions. The parameter of the PSYCHE module also comprises a flip angle β of the two small-angle chirp frequency sweep pulses. The J sampling module comprises 2N of 180° non-selective hard pulses and 2N of weak gradient field pulses, and a parameter of the J sampling module comprises a cycle number N and a strength of a gradient field pulse G7;

5) Using a Matrix Laboratory (MATLAB) software for data post-processing of the 2D spectrum data after setting the parameters, and displaying a 2D spectrum in a form of a contour map. The data post-processing comprises the following steps: (a) splicing original data to obtain spliced data, it can be seen from operator derivation that repeatedly flipping NMR signals by the 2N of 180° non-selective hard pulses in the J sampling module, repeatedly flipping coherence orders because a receiver can only receive signals of −1 coherence order, and splitting data collected in odd times according to a designed coherent order path; (b) applying a 2D Fourier transform for the spliced data to obtain a first 2D spectrum; (c) flipping an F1 dimension of the 2D spectrum to obtain a second 2D spectrum, and adding the first 2D spectrum to the second 2D spectrum to obtain superimposed spectrum data; and (d) displaying real data of the superimposed spectrum data using the contour map, that is, a phase-sensitive spectrum.

This embodiment is the method for acquiring the NMR 2D J-spectrum by suppressing strong coupling spurious peaks provided in the present disclosure, as shown in FIG. 1. Specific parameters of the pulse sequence are as follows: a time constant τ is 1 ms, an accumulation time nt is 8, an indirect dimensional evolution times ni is 40, a direct dimensional spectrum width sw is 10000 Hz, an indirect dimensional spectrum width $sw_1$ is 100 Hz, the cycle number N in the J sampling module is 70, the sweep frequency width of the chirp sweep frequency pulse is 6000 Hz, the sweep frequency time is 20 ms, the sweep frequency power is 24 dB, the flip angle β of the two chirp sweep frequency pulses in the PSYCHE module is 12°, and a sampling time t2 is 10.25 ms. Intensities of dispersion phase gradient field pulses are as follows: $G_1$=15 G/m, $G_3$=24 G/m, $G_5$=36.6 G/m, and $G_7$=3.66 G/m, and intensities of the spatial multi-layer gradient field pulses are as follows: $G_2$ is 10 G/m, $G_4$ is 0.94 G/m, and $G_6$ is 1.0 G/m. The above-mentioned parameters are set based on a Varian 500 MHz NMR spectrometer.

Figure 2:
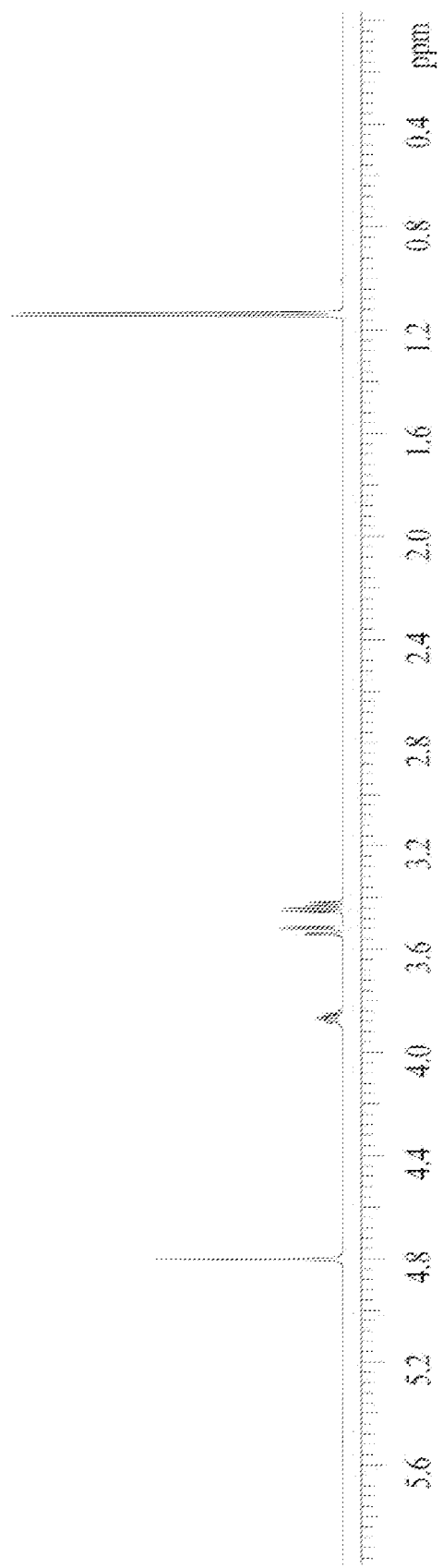
FIG. 2 illustrates a 1D $^1$H spectrum of a propylene glycol sample.
Figure 3:
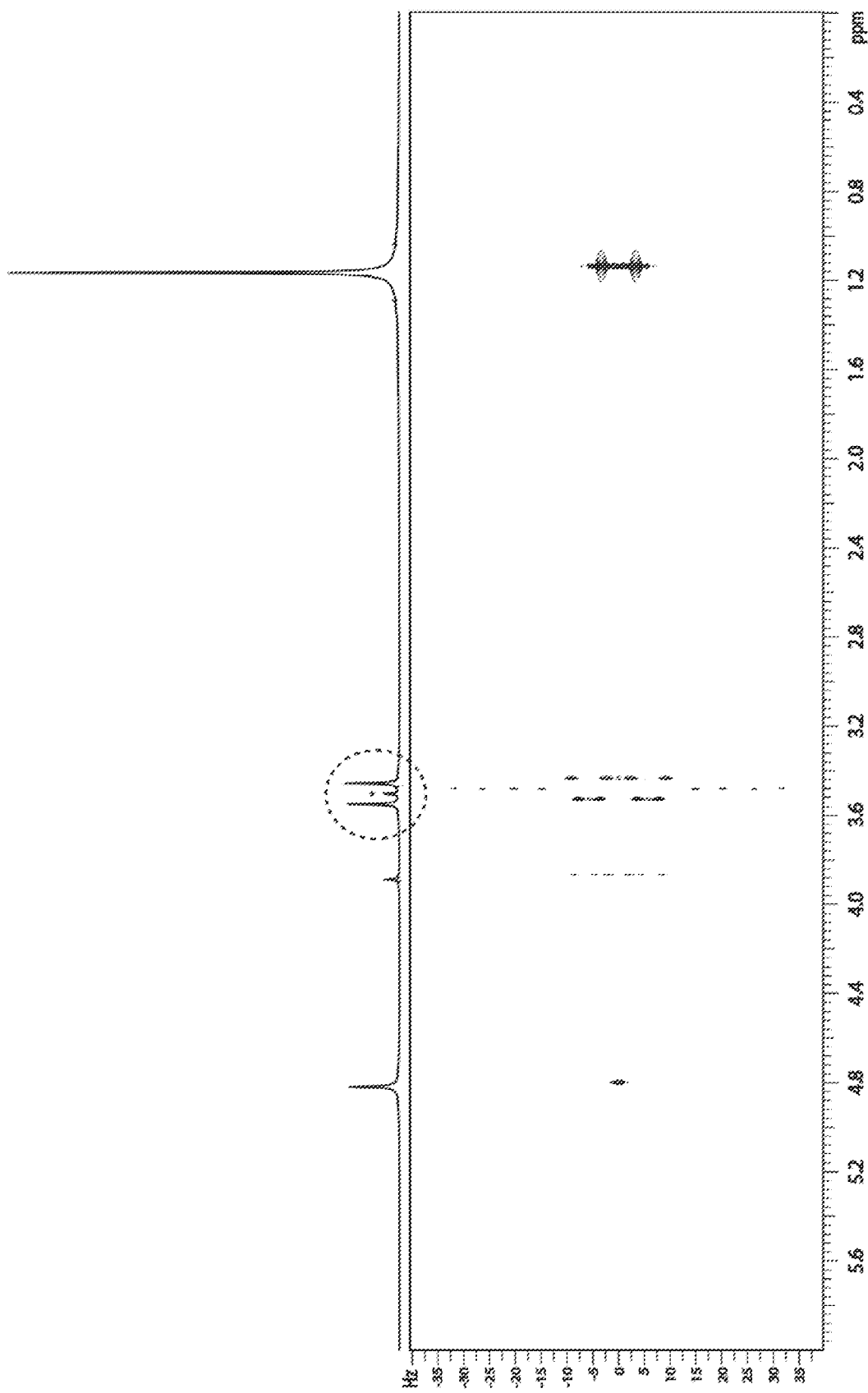
FIG. 3 illustrates a conventional 2D J-decomposition spectrum of the propylene glycol sample and a 1D projected diagram of the propylene glycol sample.
Figure 4:
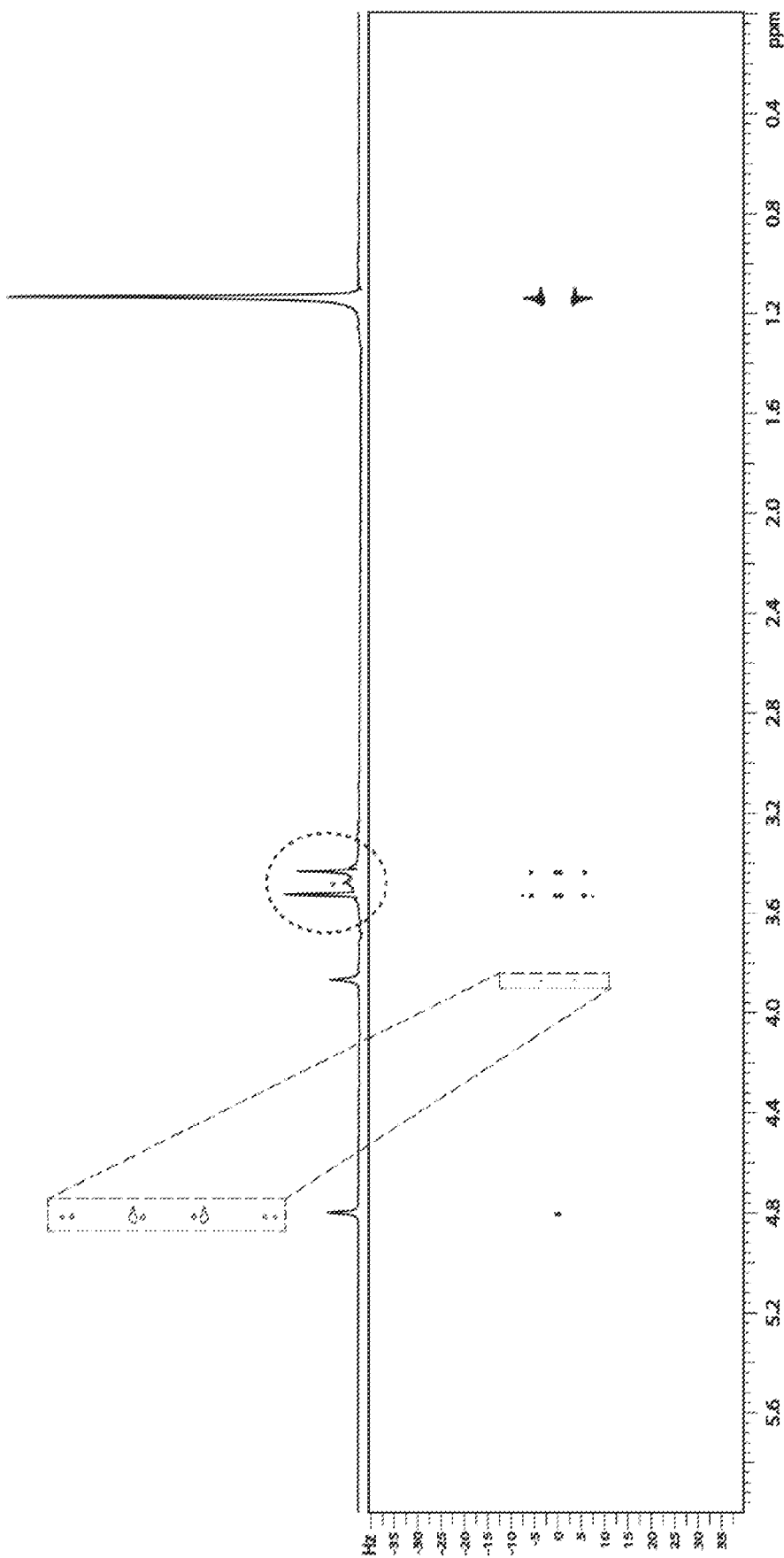
FIG. 4 illustrates a 2D phase-sensitive J spectrum and a 1D projected diagram of the propylene glycol sample collected by this method.

In this embodiment, a sample solution of propylene glycol is used, and a concentration of the sample solution is 200 mM (mMol/L). FIG. 1 illustrates the pulse sequence used in this method. FIG. 2 illustrates a 1D $^1$H spectrum of the sample solution of propylene glycol, and there is a pair of strong coupling systems from 3.2 ppm to 3.6 ppm. In the homo-nuclear 2D J-resolved spectrum in FIG. 3, the pair of strong coupling systems is subjected to mixing effects of the 180° non-selective hard pulse, resulting in the strong coupling spurious peak, which is represented by a dashed circle in FIG. 3, and * represents a position of the strong coupling spurious peak. FIG. 4 illustrates a 2D J spectrum of the sample solution of the propylene glycol obtained by this method. A comparison between FIGS. 3 and 4 is as follows. First, 1D projection diagrams of FIGS. 3 and 4 are normalized, that is, strongest peaks of projections of two spectra in FIGS. 3 and 4 are highly consistent, and a decoupling effect of a 1D projection diagram in FIG. 4 is better than FIG. 3. Second, at 3.5 ppm position of the 2D J spectrum in FIG. 4 and the homo-nuclear 2D J-resolved spectrum in FIG. 3, there is the strong coupling spurious projection in FIG. 3, and there is almost no strong coupling spurious projection in FIG. 4. Third, FIG. 3 is displayed in an absolute value displayed mode, and FIG. 4 is displayed in a phase sensitive mode. The phase-sensitive mode reserves a phase position information of NMR signal, maintains a natural intensity of spectrum peaks, and has an advantage of 1.73 times resolution. However, the absolute value mode increases a width at half height of the spectrum peaks and makes the phase position information of the spectrum peaks go missing.

In summary, the sample solution of propylene glycol used in the above-mentioned embodiments is a typical sample of the present disclosure, and the 2D J-resolved spectrum obtained using other samples with a strong coupling system still has the effects of removing strong coupling spurious peaks.

The aforementioned embodiments are merely some embodiments of the present disclosure, and the scope of the disclosure is not limited thereto. Thus, it is intended that the present disclosure cover any modifications and variations of the presently presented embodiments provided they are made without departing from the appended claims and the specification of the present disclosure.

What is claimed is:

1. A method for acquiring nuclear magnetic resonance (NMR) phase-sensitive two-dimensional (2D) J-resolved spectrum by suppressing strong coupling spurious peaks, comprising:
   1) placing a sample, collecting a conventional one-dimensional (1D) spectrum of the sample, and measuring a time width (pw) of a 90° pulse, wherein the conventional 1D spectrum provides J coupling information and chemical shift information of the sample;
   2) introducing a pulse sequence for suppressing strong coupling, setting parameters of a chirp sweep frequency pulse, a pure shift yielded by chirp excitation (PSYCHE) module, and a J sampling module, and collecting and saving data of a spectrum; and
   3) post-processing the data of the spectrum saved in step 2, and displaying a 2D spectrum in a form of a contour map, wherein the post-processing comprises following steps:
      a) splicing the data of the spectrum saved in step 2, wherein the splicing is splicing odd-numbered sampling of the data of the spectrum saved in step 2 in the J sampling module;
      b) applying a 2D Fourier transform to the data spliced in step a to obtain a first 2D spectrum; and
      c) flipping an F1 dimension of the first 2D spectrum to obtain a second 2D spectrum, and adding the first 2D spectrum to the second 2D spectrum to obtain an NMR 2D phase-sensitive J spectrum by suppressing the strong coupling spurious peaks,
   wherein the pulse sequence for suppressing the strong coupling comprises a 90° non-selective hard pulse, a first delay module $\tau_1$, a 180° forward chirp sweep frequency pulse, a second delay module $\tau_2$, a first t1/2, the PSYCHE module, a 180° reverse chirp sweep frequency pulse, a second t1/2, and a J sampling module in sequence.

2. The method according to claim 1, wherein:
in the pulse sequence for suppressing strong coupling:
a sweep direction of the 180° forward chirp sweep frequency pulse is opposite to a sweep direction of the 180° reverse chirp sweep frequency pulse, and
the method comprises adding a weak gradient field pulse G2 and a weak gradient field pulse G6 on the 180° forward chirp sweep frequency pulse and the 180° reverse chirp sweep frequency pulse.

3. The method according to claim 2, wherein the PSYCHE module comprises two chirp sweep frequency pulses with a flip angle β.

4. The method according to claim 3, wherein the J sampling module comprises 2N of 180° non-selective hard pulses and a pulse of a dispersion phase gradient field pulse.

5. The method according to claim 4, comprising:
setting a sweep frequency range, a sweep frequency time, and a sweep frequency power of the 180° forward chirp sweep frequency pulse and the 180° reverse chirp frequency sweep pulse according to pw parameters, the weak gradient field pulse G2, the weak gradient field pulse G6, the flip angle β of the two chirp sweep frequency pulses in the PSYCHE module, cycle times of the J sampling module, and the dispersion phase gradient field pulse.

6. The method according to claim 5, wherein the flip angle β is 8°-20°.

* * * * *